United States Patent [19]

Henley et al.

[11] 4,169,649

[45] Oct. 2, 1979

[54] CONNECTORS FOR USE IN FRAMES FOR HOLDING CIRCUIT CARDS

[75] Inventors: Anthony J. R. Henley, Chandler's Ford; Geoffrey W. Nutt, Eastleigh, both of England

[73] Assignee: Vero Electronics Limited, Eastleigh, England

[21] Appl. No.: 851,775

[22] Filed: Nov. 15, 1977

[30] Foreign Application Priority Data

Dec. 16, 1976 [GB] United Kingdom ............... 52649/76

[51] Int. Cl.² ......................... H01R 3/06; H01R 13/46
[52] U.S. Cl. ........................... 339/176 M; 339/14 R; 339/113 L
[58] Field of Search ............... 339/14 R, 59 R, 59 M, 339/176 M, 176 MP, 221 R, 221 M, 113 L, 276 SF

[56] References Cited

U.S. PATENT DOCUMENTS

| 3,621,444 | 11/1971 | Stein ................................. 339/14 R |
| 3,774,142 | 11/1973 | Siegler .............................. 339/14 R |

FOREIGN PATENT DOCUMENTS 793871  4/1958 United Kingdom ................ 339/221 M

OTHER PUBLICATIONS

Electrical Manufacturing, Sep. 1956, p. 220.

Primary Examiner—Neil Abrams
Attorney, Agent, or Firm—Watson, Cole, Grindle & Watson

[57] ABSTRACT

A frame for holding circuit boards, which comprises a metal back plate, pairs of opposed, channel-section guides, disposed at right angles to and extending forwardly from the back plate, for receiving the edges of circuit boards, connectors mounted on the front of the back plate for establishing electrical contact with circuits on the boards fitted into the guides, each connector including a plastics moulding, having a plane rear face and a recess on its front surface for co-operation with a board and carrying metal contact pins which project from its rear face through holes in the back plate, and an insulator disposed between the rear face of each connector and the back plate, the insulator consisting of at least one strip of plastics material having at least one row of holes to receive pins on the connector and tubular extensions which surround the portions of the pins which extend through the holes in the back plate.

2 Claims, 5 Drawing Figures

CONNECTORS FOR USE IN FRAMES FOR HOLDING CIRCUIT CARDS

Frames for holding circuit boards are known which comprise a back plate and pairs of opposed channel-section guides, which extend at right angles to the back plate, for receiving the edges of circuit boards. It is necessary to provide on the back plate connectors for establishing electrical contact with the circuits on the boards. Such connectors are fitted to the front of the back plate and consist of a plastics moulding having in its front surface sockets to receive contacts on a circuit board, or on an intermediate connector fitted to a board, and carrying metal contact pins which are in electrical contact with the sockets and project from its rear surface through holes in the back plate.

The pins extend in one, two or sometimes three rows, at a standard pitch between the pins in each row, e.g. 0.1 inch, and at a standard spacing between the rows, e.g. 0.2 inch. The pins are normally of rectangular section, measuring in a typical case $0.030'' \times 0.015''$ or $0.025'' \times 0.025''$. After attachments of the connectors to the back plate, electrical connections are established, in accordance with a given programme, by wire wrapping between the pins on the various connectors to effect appropriate electrical connections between the circuits on the boards.

It is frequently desired that the back plate should be of metal for grounding purposes and in such circumstances it is necessary to provide for electrical insulation between the pins and the back plate. In one known system this is achieved by providing, on the rear face of the moulding of each connector, integral tubular projections which surround and insulate the portions of the pins which are received in the holes in the back plate and project for a short distance from the rear face of the back plate when the connector is fitted to it.

It is often required to establish electrical contact between certain of the pins on the connectors and the metal back plate. This has hitherto involved removal of the pin in question from the connector, cutting away the corresponding tubular projection, replacing the pin and fitting around it a grounding clip constituted by a metal ring.

The object of the invention is to simplify the operation of establishing electrical contact between desired pins on the connectors and the back plate, and to avoid the necessity of removing the pins when such operation is to be performed.

The invention accordingly provides a frame for holding circuit boards, which comprises a metal back plate, pairs of opposed, channel-section guides, disposed at right angles to and extending forwardly from the back plate, for receiving the edges of circuit boards, connectors mounted on the front of the back plate for establishing electrical contact with circuits on the boards fitted into the guides, each connector including a plastics moulding, having a plane rear face and a recess in its front surface for cooperation with a board and carrying metal contact pins which project from its rear face through holes in the back plate, and an insulator disposed between the rear face of each connector and the back plate, the insulator consisting of at least one strip of plastics material having at least one row of holes to receive pins on the connector and tubular extensions which surround the portions of the pins which extend through the holes in the back plate.

Accordingly a standard connector may be rapidly adapted for use with a metal back plate by fitting such an insulator to it. The particular section of the insulator corresponding to a pin which is to be electrically connected to the back plate can readily be cut off before fitting the insulator to the connector.

Electrical contact between the pin so bared and the back plate can then be effected by placing a metal ring around the portion of the pin which extends through the back plate.

The invention includes an insulator, for use in such a frame, comprising a flat strip of plastics material having at least one row of regularly spaced holes extending longitudinally of the strip and, projecting from one face of the strip, tubular extensions in register with the holes.

The invention will now be further described with reference to the accompanying drawing, in which.

Figure 1:
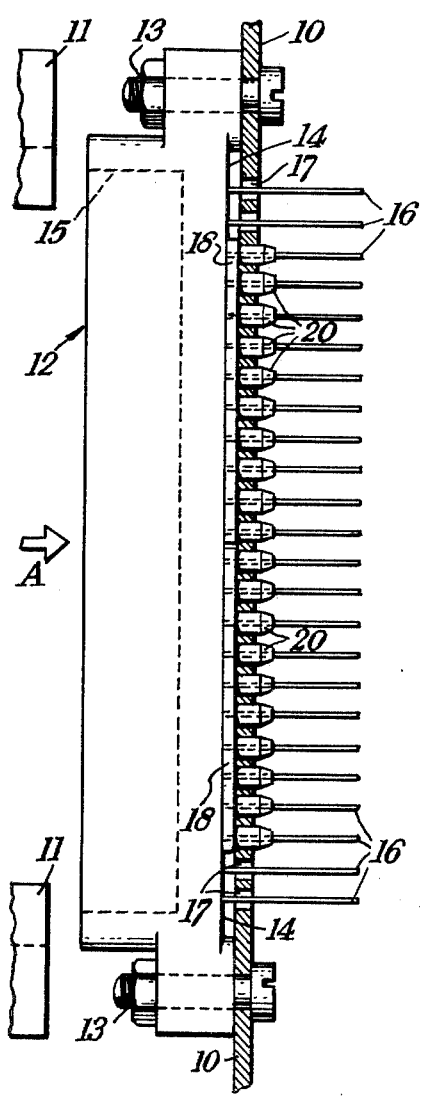
FIG. 1 is a sectional view through the rear portion of a frame for holding circuit boards.

The frame, of which part only is shown in FIG. 1, is of the kind described in more detail in U.S. Pat. Nos. 3,458,767 and 3,511,385. It includes a metal back plate 10 and a number of pairs of channel-section guides 11 for accommodating the edges of circuit boards, each of which can be slid endwise, in the direction indicated by the arrow A, into engagement with a connector 12, which is attached to the back plate by nut and bolt connections 13.

A connector 12 is associated with each pair of guides 11 and each connector is constituted by a moulding of plastics material having a flat rear face 14 and a recess 15 in its front face for the reception of a circuit board, or a connector attached thereto. The recess 15 contains contacts, not shown, connected to one or more rows of equally spaced contact pins 16, which project rearwardly from the face 14 through holes 17 in a back plate 10. The contacts in the recess establish electrical contact between components in the board and the pins 16.

The pins 16, in the embodiment shown in FIG. 1, are insulated from the back board by flat strips 18, moulded from plastics material and interposed between the flat rear face 14 of the connector and the back plate 10. Each strip 18 has a row of longitudinally extending, equally spaced holes 19 for passage of the pins 16 and rearwardly extending tubular projections 20, in register with the holes 19, which surround the portions of the pins 16, which extend through the holes 17 in the back plate 10. Each strip has transversely extending grooves 21 disposed between the projections 20.

If it is desired to connect any particular pin 16 electrically to the back plate 10, the corresponding portion of the strip 18, including the extension 20, is cut off before fitting the strip 18 to the connector 12, this operation being facilitated by the grooves 21. In the case shown in FIG. 1, the two uppermost and the two lowermost pins 16 have been so bared. Metal contact rings can then be fitted around these bared pins 16 into the corresponding holes 17 to effect earthing of the pins.

Figures 2, 3:
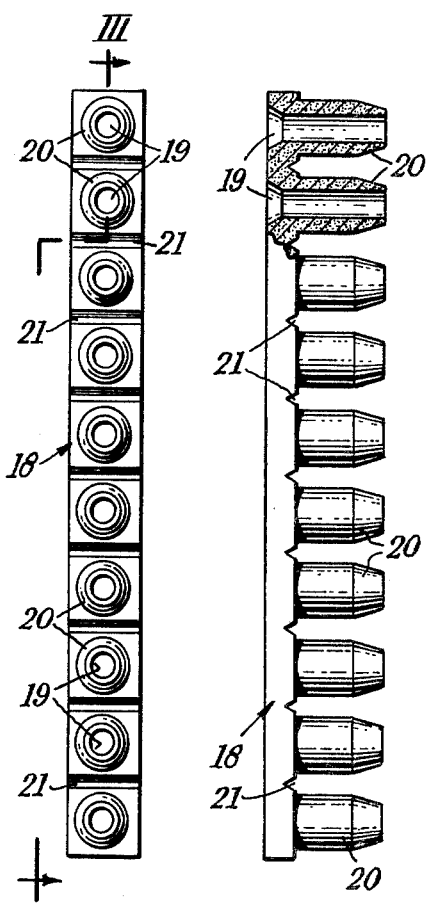
FIG. 2 is a plan view of a back plate insulator.
FIG. 3 is a view on the line III—III in FIG. 2.

As shown in FIG. 3, each hole 19 is flared to facilitate fitting the strip 18 to the pins 16.

As an alternative to using strips 18 of length corresponding to that of the connectors 12, it is possible to constitute the back plate insulator of a plurality of differently coloured plastic mouldings which abut end to end.

Figure 4:
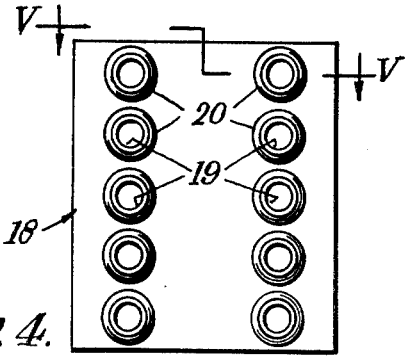
FIG. 4 is a plan view of an alternative form of back plate insulator.
Figure 5:
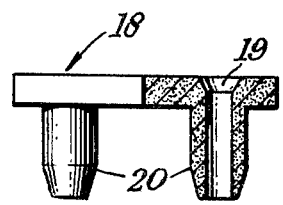
FIG. 5 is a view on the line V—V in FIG. 4.

A typical embodiment of such shorter insulator is illustrated in FIGS. 4 and 5. As will be seen it serves to insulate two rows of pins 16, each containing five pins. By using sections differently coloured in two or more colours in accordance with a colour coding system, the extensions 20 of the insulator which project rearwardly through the back plate 10 will constitute a visual back wiring aid to assist the operator in selecting the pins around which wire wrapped connections are to be made. In both embodiments illustrated, the projections 20 have round holes which will accept pins 16 both of square and oblong section.

What we claim as our invention and desire to secure by Letters Patent is:

1. A frame for holding circuit boards, which comprises a metal back plate, pairs of opposed, channel-section guides, disposed at right angles to and extending forwardly from the back plate, for receiving the edges of circuit boards, connectors mounted on the front of the back plate for establishing electrical contact with circuits on the boards fitted into the guides, each connector including a plastics moulding, having a plane rear face and a recess on its front surface for cooperation with a board and carrying metal contact pins which project from its rear face through holes in the back plate, and an insulator disposed between the rear face of each connector and the back plate, the insulator consisting of at least one strip of plastics material having at least one row of holes to receive said contact pins on the connector and tubular extensions which surround the portions of said contact pins which extend through the holes in the back plate, said plastics material and the tubular extensions being adapted to be removed enabling electrical contact to be established between said metal contact pins and said metal back plate by removal of the intervening plastics material, and each connector has fitted to each rear face an insulator including a plurality of differently colored strips of plastic material which abut end to end.

2. A frame for holding circuit boards, which comprises a metal back plate, pairs of opposed, channel-section guides, disposed at right angles to and extending forwardly from the back plate, for receiving the edges of circuit boards, connectors mounted on the front of the back plate for establishing electrical contact with circuits on the boards fitted into the guides, each connector including a plastics moulding, having a plane rear face and a recess on its front surface for cooperation with a board and carrying metal contact pins which project from its rear face through holes in the back plate, and an insulator disposed between the rear face of each connector and the back plate, the insulator consisting of at least one strip of plastics material having at least one row of holes to receive said contact pins on the connector and tubular extensions which surround the portions of said contact pins which extend through the holes in the back plate, said plastics material and the tubular extensions being adapted to be removed enabling electrical contact to be established between said metal contact pins and said metal back plate by removal of the intervening plastics material, and each insulator has transverse grooves in its rear face between the tubular projections to define removable portions of said insulator.

* * * * *